United States Patent
Wu

(10) Patent No.: US 7,359,275 B1
(45) Date of Patent: Apr. 15, 2008

(54) REDUCED SIZE DUAL-PORT SRAM CELL

(75) Inventor: Chau-Chin Wu, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 110 days.

(21) Appl. No.: 11/222,390

(22) Filed: Sep. 8, 2005

(51) Int. Cl.
 *G11C 8/00* (2006.01)
(52) U.S. Cl. .................. 365/230.05; 365/154; 365/233
(58) Field of Classification Search ........... 365/230.05, 365/154, 233
 See application file for complete search history.

(56) References Cited

U.S. PATENT DOCUMENTS

| | | | |
|---|---|---|---|
| 5,289,432 A | | 2/1994 | Dhong et al. |
| 6,118,689 A | * | 9/2000 | Kuo et al. .................. 365/154 |
| 6,216,205 B1 | * | 4/2001 | Chin et al. .................. 711/131 |
| 6,882,562 B2 | * | 4/2005 | Beucler ....................... 365/154 |
| 6,920,061 B2 | * | 7/2005 | Bhavnagarwala et al. .. 365/154 |
| 6,967,861 B2 | * | 11/2005 | Braceras et al. ............ 365/154 |
| 7,075,842 B2 | * | 7/2006 | Tzartzanis et al. .......... 365/205 |
| 7,139,204 B1 | * | 11/2006 | Behera ....................... 365/201 |

* cited by examiner

*Primary Examiner*—Hoai V. Ho
(74) *Attorney, Agent, or Firm*—Glass & Associates

(57) ABSTRACT

A dual-port Static Random Access Memory (SRAM) cell is disclosed that includes a storage element that is operable to store a data bit and a complement data bit. The dual-port SRAM cell further includes read access circuitry dedicated exclusively to a read operation and write access circuitry dedicated exclusively to a write operation. The read operation and the write operation are performed in a staggered manner. With the read operation performed exclusive on one port and the write operation performed exclusively on the other port of the SRAM cell, smaller transistors can be used to reduce the size of the SRAM cell.

19 Claims, 7 Drawing Sheets

US 7,359,275 B1

REDUCED SIZE DUAL-PORT SRAM CELL

FIELD OF THE INVENTION

The present invention relates generally to the field of integrated circuits. More specifically, the present invention relates to dual-port static random access memory cell circuitry.

BACKGROUND ART

Dual-port Static Random Access Memory (SRAM) cells can be simultaneously accessed through both ports. This means that either port of the dual-port SRAM cells can perform both read and write operations. In order for both ports of a dual-port SRAM cell to perform both read and write operations, the dual-port SRAM cells must have large access transistors for a write operation and pull-down NMOS transistors for a read operation. For this reason, conventional dual-port SRAM cells are not very scalable.

In a write operation, to write a logic 1 or HIGH to a memory cell that previously stored a logic 0, the access transistor has to pull the pull-down NMOS transistor out of the saturated state (ON state). Pulling up a saturated NMOS device requires large access transistors. Large access transistors occupy large silicon area and present large capacitive loads. For example, in a six transistor (6-T) dual-port SRAM cell, the access transistor has to be at least 10 times larger than the pull-down NMOS transistor of the memory cell. In an eight transistor (8-T) dual-port SRAM cell, the use of a complement read transistor and a complement write transistor has partially alleviated the large access transistor problems in a write operation since the complement write access transistor assists the write access transistor in pulling the saturated pull-down NMOS transistor. However, the other access transistor is still a large transistor that takes up valuable surface area and presents high capacitive loading to the memory cell.

In a read operation, large pull-down NMOS transistors are required to prevent the large access transistors from inadvertently flipping the logic state of the inverters. Accordingly, in 6-T dual-port SRAM cells, the pull-down NMOS transistors have to be at least 10 times larger than the access transistors to avoid unwanted logic state change caused by the large access transistors. Therefore, transistors in dual-port SRAM cell have to be properly sized so that a port can perform both read operation and write operation. This means that the pull-down NMOS transistors and the access transistors in conventional dual-port SRAM cells have to be large transistors, thus occupying a large silicon area and presenting large capacitive load.

Although six-transistor (6-T) dual-port SRAM cells have only six transistors instead of eight transistors, they require a write voltage control circuit to apply the correct write voltages to the first bitline and wordline. Without this write voltage control circuit write circuitry, the conventional 6-T dual-port SRAM cells will not have the correct write voltages. Furthermore, another voltage control circuit is required to reduce the voltage level on the power supply line when the write circuit applies the write voltages. The cell area of the prior art 6-T dual-port SRAM cell is reduced, but the overall silicon surface area of the dual-port SRAM array is not reduced because each cell needs the extra voltage level control circuits.

Thus, there is a need for a reduced size dual-port SRAM cell and a dual-port SRAM cell array. Also there is a need for a reduced size dual-port SRAM cell that does not require large access transistors. Furthermore, there is a need for a dual-port SRAM cell array that does not require additional voltage-level control circuitry.

SUMMARY OF THE INVENTION

A dual-port Static Random Access Memory (SRAM) cell is disclosed that includes a storage element that is operable to store a data bit and a complement data bit. The dual-port SRAM cell further includes read access circuitry dedicated exclusively to a read operation and write access circuitry dedicated exclusively to a write operation. The read operation and the write operation are performed in a staggered manner within a clock cycle. The structure and method of operation of the present invention obviate the needs for large transistors and thus enable the use of small transistors. This significantly reduces the size of the storage element and thus the surface area of the dual-port SRAM cell as well as the surface area of the dual-port SRAM cell array.

A method of coupling data bits within a dual-port Static Random Access Memory (SRAM) cell having a first port and a second port is disclosed that includes the steps of receiving a clock signal, performing a read operation exclusively on the first port of the dual-port SRAM cell, and performing a write operation exclusively on the second port of the dual-port SRAM cell. The read operation and the write operation are performed in a staggered manner in one cycle of the clock signal.

Accordingly, the method and apparatus of the present invention provides a dual-port SRAM cell and a dual-port SRAM cell array that occupy less surface area of the semiconductor substrate. In addition, the method and apparatus of the present invention do not require additional voltage-level control circuitry as is required by some prior art six transistor dual port SRAM cells. These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
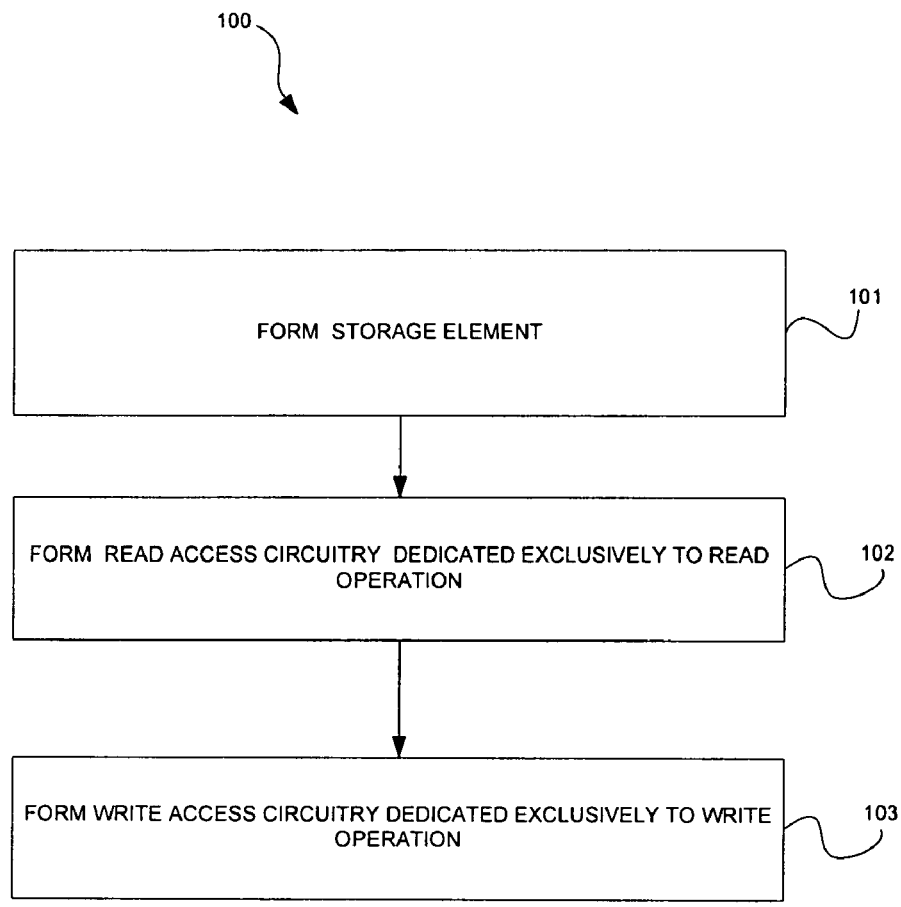
FIG. 1 shows a method of fabricating a reduced size dual-port Static Random Access Memory (SRAM) in accordance with an embodiment of the present invention.

Referring to FIG. 1, a method 100 of fabricating a reduced size dual-port Static Random Access Memory (SRAM) cell is illustrated. Referring to step 101, a storage element is formed on a semiconductor substrate. The storage element is operable to store a data bit. In one embodiment the storage element is also operable to store a complement data bit. In one embodiment of the present invention, step 101 includes forming a Complement Metal Oxide (CMOS) latch that includes a first Complementary Metal Oxide (CMOS) inverter and a second CMOS inverter that are mutually cross-coupled, e.g., the input of the first CMOS inverter is electrically coupled to the output of the second CMOS inverter and vice versa. In the present embodiment, the first CMOS inverter includes a pull-up PMOS transistor and a pull-down NMOS transistor. The second CMOS inverter also includes a pull-up PMOS transistor and a pull-down NMOS transistor.

Referring to step 102, read access circuitry is formed that is dedicated exclusively to a read operation. In one embodiment of the present invention, the read access circuitry includes an n-channel Metal Oxide Semiconductor (NMOS) transistor. Because the read access NMOS transistor is dedicated exclusively to the read operation, it does not have to pull up the saturated pull-down NMOS transistors in the storage element. Thus, the read access NMOS transistor can be formed with a size smaller than that of the pull-down NMOS transistor. Since the read access NMOS transistor is a small size transistor, it does not accidentally flip the logic state stored in the storage element during a read operation as occurs in prior art dual-port devices having large read access NMOS transistors. As a result, the pull-down NMOS transistor does not have to be a large transistor to maintain the logic state. In the present embodiment, the read access circuitry has a size that is smaller than that of either pull-down NMOS transistor of the storage element. In one embodiment, the read access circuitry includes a single NMOS transistor that has a smaller channel length, a smaller channel width, a smaller surface area, and a smaller ratio of width over length (W/L) than either of the pull-down NMOS transistor of the storage element. In one embodiment of the present invention, a complement read access NMOS transistor is also formed to read a complement data bit from the storage element. A bitline and a wordline are also formed that are electrically connected to the read access NMOS transistor. In one embodiment, a complement bitline is formed that is electrically connected to the complement read access NMOS transistor. The complement bitline is operable to couple the complement data bit into the read access NMOS transistor.

Referring to step 103, write access circuitry is formed that is dedicated exclusively to a write operation. In one embodiment of the present invention, the write access circuitry includes an n-channel Metal Oxide Semiconductor (NMOS) transistor. Since the write access transistor is dedicated exclusively to write operation, the pull-down NMOS transistor does not have to be a large transistor to prevent the read access NMOS transistor from accidentally flipping the logic state stored in the storage element. Because the pull-up NMOS transistor is not a large transistor, the write access NMOS transistor does not have to be a large transistor to write over the logic state caused by the pull-down NMOS transistor. Thus, the write access NMOS transistor can be formed with a size smaller than that of the pull-down NMOS transistor. In the present embodiment, the write access circuitry has a size that is smaller than that of either the pull-down NMOS transistor of the storage element. In one embodiment, the write access circuitry includes a single NMOS transistor that has a smaller channel length, a smaller channel width, a smaller surface area, a smaller ratio of width over length (W/L) than either of the pull-down NMOS transistor of the storage element. In one embodiment of the present invention, a complement write access NMOS transistor is also formed to write a complement data bit into the storage element. A bitline and a wordline are also formed that are electrically connected to the write access NMOS transistor. In one embodiment, a complement bitline is formed that is electrically connected to the complement write access NMOS transistor. The complement bitline is operable to couple the complement data bit into the write access NMOS transistor.

Figure 2:
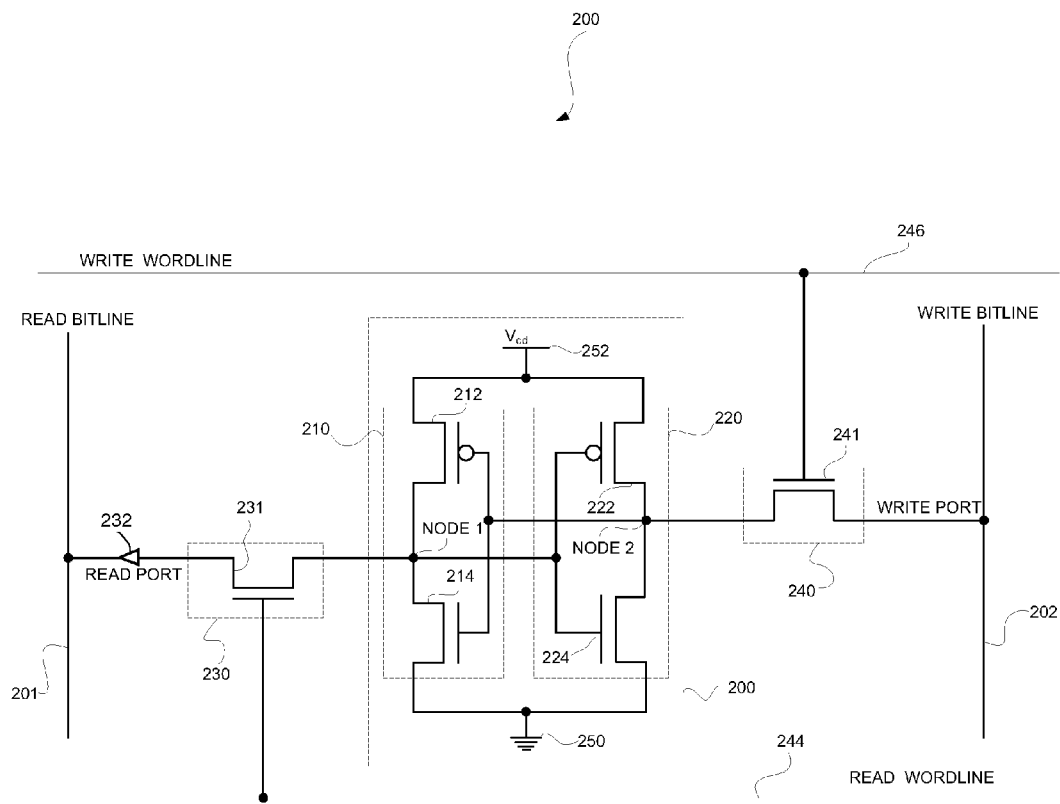
FIG. 2 illustrates a schematic diagram of a six-transistor (6-T) dual-port SRAM cell that has port one dedicated exclusively to reading operations and port two dedicated exclusively to writing operations in accordance with an embodiment of the present invention.

Now referring to FIG. 2, a six-transistor (6-T) dual-port Static Random Access Memory (SRAM) cell 200 is shown that is formed in accordance with method 100 of FIG. 1. 6-T dual-port SRAM memory cell 200 includes a storage element 200. In one embodiment of the present invention, storage element 200 includes a first Complementary Metal Oxide Semiconductor (CMOS) inverter 210 mutually cross-coupled to a second CMOS inverter 220 to form a CMOS latch. A CMOS latch is a feedback type regenerative storage element operable to store a data bit and a complement data bit (Step 101). The output of first CMOS inverter 210 is electrically connected to the input of second CMOS inverter 220, and the input of first CMOS inverter 210 is electrically connected to the output of second CMOS inverter 220.

Continuing with FIG. 2, first CMOS inverter 210 has a pull-up PMOS transistor 212 coupled in series to a pull-down NMOS transistor 214. The gate of pull-up PMOS transistor 212 electrically coupled to the gate of pull-down NMOS transistor 214 to form the input of first CMOS inverter 210. The drain of pull-up PMOS transistor 212 is coupled to the drain of pull-down NMOS transistor 214 to form the output of first CMOS inverter 210 at node 1. Node 1 is an internal node that stores a data bit (Step 101).

Similarly, second CMOS inverter 220 has a pull-up PMOS transistor 222 coupled in series to a pull-down NMOS transistor 224. The gate of pull-up PMOS transistor 222 electrically coupled to the gate of pull-down NMOS transistor 224 to form the input of second CMOS inverter 220, which is coupled to the output of first CMOS inverter 210 at node 1. The drain of pull-up PMOS transistor 222 coupled to the drain of pull-down NMOS transistor 224 to form the output of second CMOS transistor 220 at node 2, which is coupled to the input of first CMOS inverter 210. The source of pull-up PMOS transistor 222 of second CMOS inverter 220 is electrically coupled the source of pull-up PMOS transistor 212 of first CMOS inverter 210 and to a supply voltage ($V_{dd}$) 252. The source of pull-down NMOS transistor 224 of second CMOS inverter 220 is electrically connected to the source of pull-down transistor 224 of first CMOS inverter 210 and to an electrical ground 250 (Step 101).

Referring again to FIG. 2, 6-T dual-port SRAM memory cell 200 also includes READ access circuitry 230. In the present embodiment, READ access circuitry 230 includes an NMOS transistor 231. It is understood that READ access circuitry 230 can also include other type of transistors and combinations of other transistors thereof without deviating from the present invention. READ access NMOS transistor 231 is dedicated exclusively to read operations. The drain of READ access NMOS transistor 231 is electrically connected to READ bitline 201. In one embodiment, the drain of READ access NMOS transistor 231 is electrically connected to an inverter 232. Inverter 232 inverts the compliment data bit so that READ access circuitry 230 reads out the data bit instead of the complement data bit. In one embodiment, inverter 232 can be included in the sense amplifier that is electrically connected to read bitline 201. The source of READ access transistor 231 is electrically connected to the output of first CMOS inverter 210 at node 1. The source of READ access NMOS transistor 231 is also electrically connected to the input of second CMOS inverter 220. The gate of READ access NMOS transistor 231 is electrically connected to a READ wordline 244. In the present embodiment, the surface area, the channel, the width, and the ratio of width over length (W/L) of READ access NMOS transistor 231 is smaller than that of either first pull-down NMOS transistor 214 or second pull-down NMOS transistor 224. Because READ access NMOS transistor 231 does not have to pull pull-down NMOS transistor 214 out of its saturated state to write a logic 1 at node 1, READ access NMOS transistor 231 does not have to be a large transistor. Furthermore, because pull-down NMOS transistor 214 does not have to prevent READ access NMOS transistor 231 from inadvertently flipping the logic state at node 1 during a read operation, it does not have to be a large transistor.

Continuing with FIG. 2, 6-T dual-port SRAM memory cell 200 also includes WRITE access circuitry 240. In the present embodiment, WRITE access circuitry 220 includes an NMOS transistor 241. It is understood that WRITE access circuitry 240 can also include other type of transistors and combinations of transistors thereof without deviating from the present invention. WRITE access NMOS transistor 241 is dedicated exclusively to write operations. The drain of WRITE access NMOS transistor 241 is electrically connected to a WRITE bitline 202. The source of WRITE access NMOS transistor 241 is electrically connected to the output of second CMOS inverter 220 at node 2. The source of WRITE access NMOS transistor 241 is also electrically connected to the input of first CMOS inverter 210. The gate of WRITE access NMOS transistor 241 is electrically connected to a WRITE wordline 246. In the present embodiment, the surface area, the channel, the width, and the ratio of width over length (W/L) of WRITE access NMOS transistor 241 is smaller than that of either first pull-down NMOS transistor 224 or second pull-down NMOS transistor 214. Because pull-down NMOS transistor 224 does not have to prevent WRITE access NMOS transistor 241 from inadvertently flipping the logic state at node 2 during a read operation. Because WRITE access NMOS transistor 241 is dedicated exclusively to a write operation, it does not have to be a large transistor. Since pull-down NMOS transistor 224 does not have to be a large transistor, WRITE access NMOS transistor 241 does not have to be a large transistor to write a new logic state on node 2.

Figure 3:
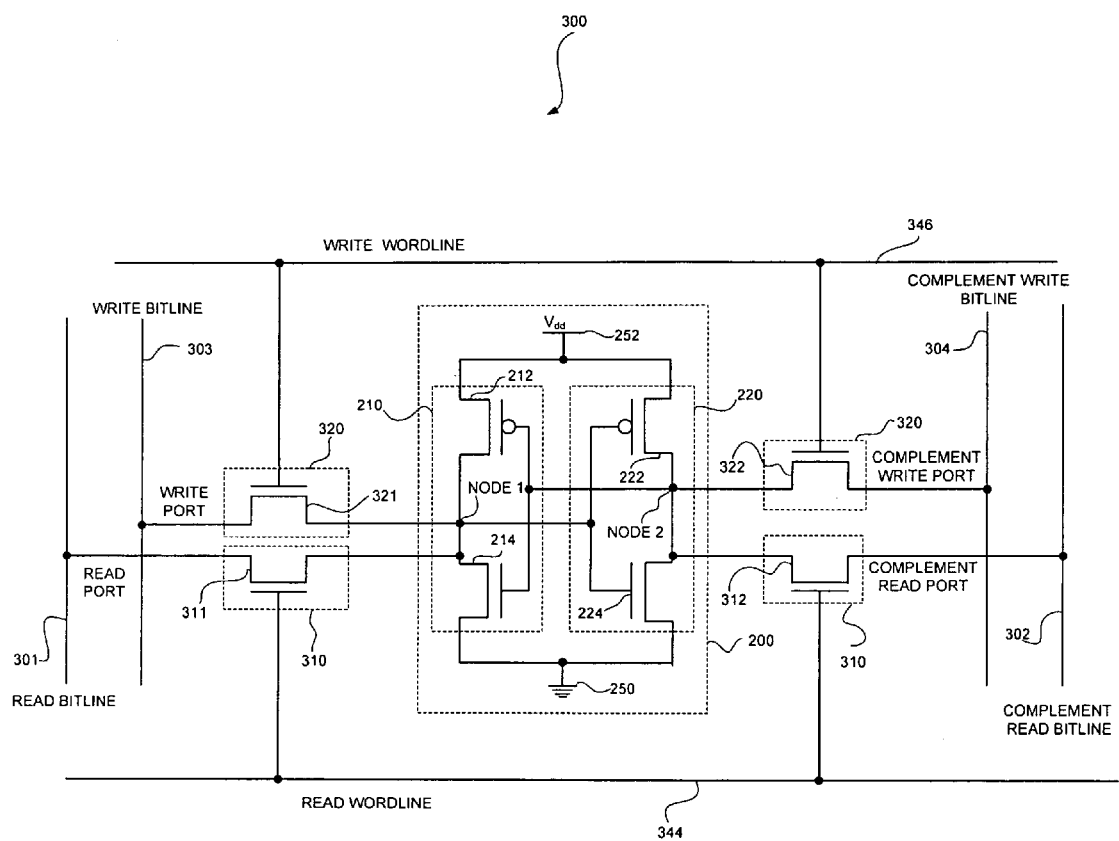
FIG. 3 illustrates a schematic diagram of an eight-transistor (8-T) dual-port SRAM cell that has port one dedicated exclusively to reading operations and port two dedicated exclusively to writing operations in accordance with an embodiment of the present invention.

Now referring to FIG. 3, an eight-transistor (8-T) dual-port Static Random Access Memory (SRAM) cell 300 is shown that is formed in accordance with method 100 of FIG. 1. 8-T dual-port SRAM memory cell 300 includes a storage element 200 that is the same as that of the 6-T dual-port SRAM 200 of FIG. 2. The storage element of 8-T dual-port SRAM 300 includes a first CMOS inverter 210 cross-coupled to a second CMOS inverter 220 to form a CMOS latch operable to store a data bit at node 1 and a complement data bit at node 2.

8-T dual-port SRAM memory cell 300 includes READ access circuitry 310. In the present embodiment, READ access circuitry 310 includes an NMOS transistor 311. It is understood that READ access circuitry 310 can also include other type of transistors and combinations of transistors thereof without deviating from the present invention. READ access NMOS transistor 311 is dedicated exclusively to read operations. The drain of READ access NMOS transistor 311 is electrically connected to READ bitline 301. The source of READ access NMOS transistor 311 is electrically connected to the output of first CMOS inverter 210 at node 1. The gate of READ access NMOS transistor 311 is electrically connected to a READ wordline 344. In the present embodiment, the surface area, the channel, the width, and the ratio of width over length (W/L) of READ access NMOS transistor 311 is smaller than that of either first pull-down NMOS transistor 214 or second pull-down NMOS transistor 224 (step 102). READ access NMOS transistor 311 does not have to pull pull-down NMOS transistor 214 out of the saturated mode, and thus READ access NMOS transistor 311 does not have to be a large transistor. On the other hand, because pull-down NMOS transistor 214 does not have to prevent READ access NMOS transistor 311 from inadvertently flipping the logic state at node 1, the size of pull-down NMOS transistor 214 is significantly reduced. The size of pull-down NMOS transistor 214 is significantly reduced by at least 50%.

READ access circuitry 310 also includes a complement READ access NMOS transistor 312. Complement READ access NMOS transistor 312 is dedicated exclusively to reading a complement data bit from node 2 of storage element 200. The gate of complement READ access NMOS transistor 312 is electrically connected to READ wordline 344. The source of complement READ access transistor 336 is electrically connected to the output of second CMOS inverter 220 at node 2. The drain of complement READ access transistor 336 is electrically connected to a complement READ bitline 302. In the present embodiment, the surface area, the channel, the width, and the ratio of width over length (W/L) of complement READ access NMOS transistor 312 is smaller than that of either first pull-down NMOS transistor 214 or second pull-down NMOS transistor 224 (step 102). Because complement READ access NMOS transistor 312 is dedicated exclusively to read a complement data bit at node 2, it does not have to pull pull-down NMOS transistor 224 out of the saturated mode. Thus, complement READ access NMOS transistor 312 does not have to be a large transistor. Since complement READ access NMOS transistor 312 is not a large transistor, pull-down NMOS transistor 224 does not have to be a large transistor because pull-down NMOS transistor 224 does not have to prevent complement READ access NMOS transistor 312 from inadvertently flip the logic state at node 2 during a read operation.

Continuing with FIG. 3, 8-T dual-port SRAM cell 300 also includes WRITE access circuitry 320. In the present embodiment, WRITE access circuitry 320 includes an NMOS transistor 321. It is understood that WRITE access circuitry 320 can also include other type of transistors and combinations of transistors thereof without deviating from the present invention. WRITE access NMOS transistor 321 is dedicated exclusively to write operations. The drain of WRITE access NMOS transistor 321 is electrically connected to a WRITE bitline 303. The source of WRITE access transistor 321 is electrically connected to the output of first CMOS inverter 210 at node 1 and to the input of second CMOS inverter 220. The gate of WRITE access NMOS transistor 321 is electrically connected to a WRITE wordline 346. In the present embodiment, the surface area, the channel, the width, and the ratio of width over length (W/L) of WRITE access NMOS transistor 321 is smaller than that of either first pull-down NMOS transistor 214 or second pull-down NMOS transistor 224. Because pull-down NMOS transistor 214 does not have to prevent WRITE access NMOS transistor 321 from inadvertently flipping the logic state at node 1 during a read operation (WRITE access NMOS transistor 321 is dedicated exclusively to a write operation), it does not have to be a large transistor. Because the size of pull-down NMOS transistor 214 is significantly reduced, WRITE access NMOS transistor 321 does not have to be a large transistor to write a new logic state on node 1.

WRITE access circuitry 320 also includes a complement WRITE access NMOS transistor 322. Complement WRITE access NMOS transistor 322 is dedicated exclusively to writing a complement data bit into node 2 of storage element 200. The gate of complement WRITE access NMOS transistor 322 is electrically connected to WRITE wordline 346. The source of complement WRITE access transistor 322 is electrically connected to the output of second CMOS inverter 220 at node 2. The source of complement WRITE access transistor 322 is also electrically connected to the input of first CMOS inverter 210. The drain of complement WRITE access transistor 322 is electrically connected to a complement WRITE bitline 304. In the present embodiment, the surface area, the channel, the width, and the ratio of width over length (W/L) of complement WRITE access NMOS transistor 322 is smaller than that of either first pull-down NMOS transistor 214 or second pull-down NMOS transistor 224. Because pull-down NMOS transistor 224 does not have to prevent complement WRITE access NMOS transistor 322 from inadvertently flipping the logic state at node 1 during a read operation (complement WRITE access NMOS transistor 322 is dedicated exclusively to a write operation), the size of pull-down NMOS transistor is significantly reduced by at least 50%. Because the size of pull-down NMOS transistor 224 is significantly reduced, complement WRITE access NMOS transistor 322 does not have to be a large transistor to write a new logic state on node 2.

Referring again to 8-T dual-port SRAM cell 300, complement WRITE access NMOS transistor 322 assists in the writing of a new logic state into storage element 200, thus reducing further the size of WRITE access NMOS transistor 321 and complement WRITE access NMOS transistor 322.

Figure 4:
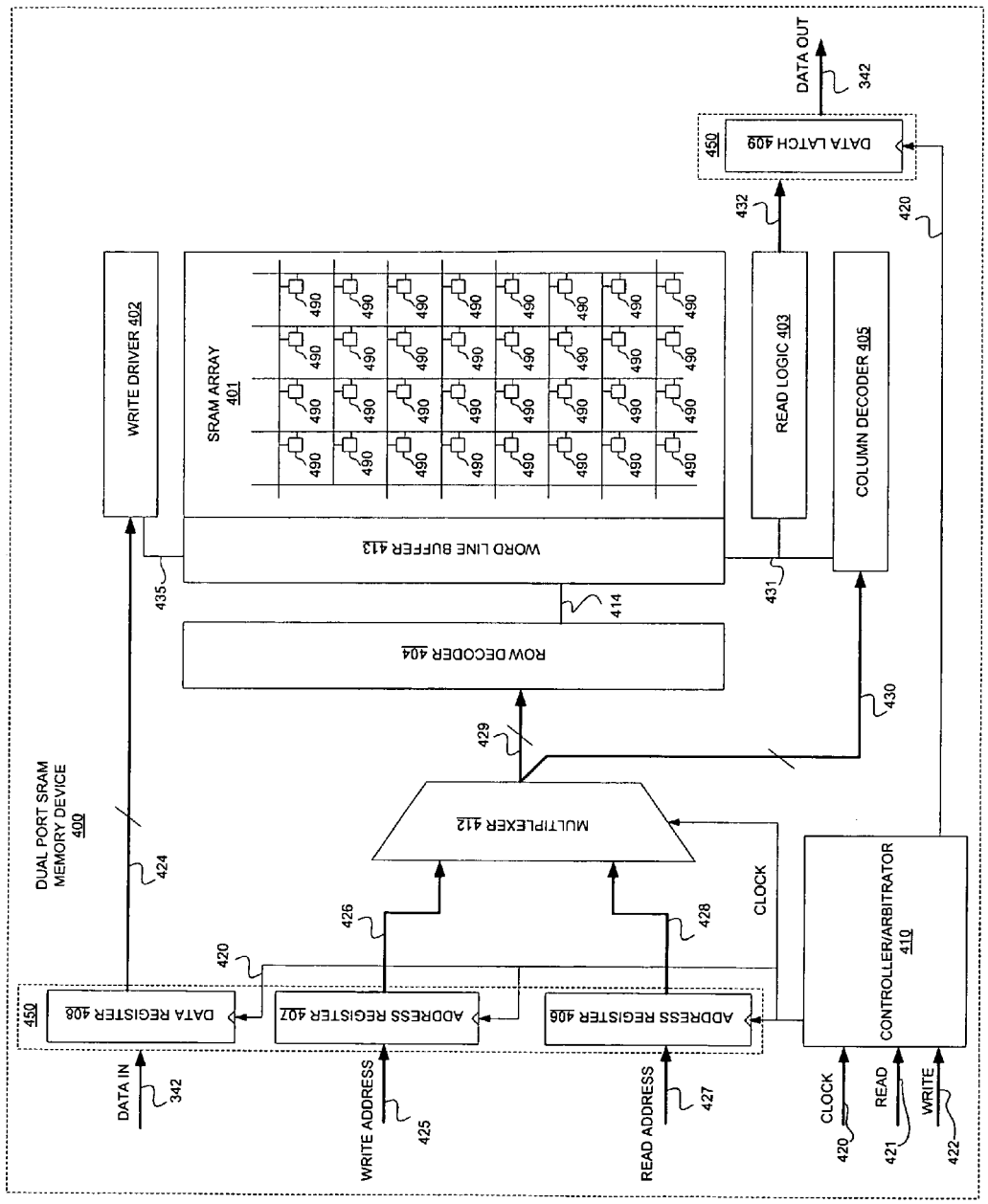
FIG. 4 is a block diagram of a dual-port SRAM memory device in accordance with an embodiment of the present invention.

Now referring to FIG. 4, the internal structure of a dual-port SRAM memory device 400 is shown that includes an array of dual-port SRAM cells. Dual-port SRAM memory device 400 can be used, for example, in the modular architecture of a mobile phone system to facilitate data communication between a baseband processor and an application processor.

Dual-port SRAM memory device 400 includes an array of dual-port SRAM cells 401 that are fabricated in accordance with method 100 of FIG. 1. Array of dual-port SRAM cells 401 is arranged in rows and columns. Each row is represented by a bitline and each column is represented by a READ wordline and a WRITE wordline. In one embodiment, all of dual-port SRAM cells 490 of array 401 are 6-T dual-port SRAM cells 200 shown FIG. 2. A row is specified by READ wordline 244 and WRITE wordline 246. A column is specified by either READ bitline 201 or WRITE bitline 204. Any 6-T dual-port SRAM cell 200 can be selected for a read operation by specifying READ wordline 242 and READ bitline 201. Any 6-T dual-port SRAM cell 200 can be selected for a write operation by specifying WRITE wordline 246 and WRITE bitline 202.

In another embodiment, all of dual-port SRAM cells 490 of array 401 are 8-T dual-port SRAM cells 300 shown in FIG. 3. Each row now is represented by either READ wordline 344 or WRITE wordline 346. Each column is represented by READ bitline 301, complement READ bitline 302, WRITE bitline 303, and complement WRITE bitline 304.

Continuing with FIG. 4, dual-port SRAM memory device 400 includes an input/output (I/O) circuitry 450. I/O circuitry 450 further includes a data register 408, data latch 409, read address register 406, and write address register 406. Data register 408 is electrically connected to a write driver 402 via signal path 442. Write addresses are received by address register 407 via a write address signal path 425. Read addresses are received by address register 406 via read address signal path 427. Write addresses and read addresses are input to a multiplexer 412 via a signal path 426 and a signal path 428 respectively. The outputs of multiplexer 412 are fed to a row decoder 404 via a signal path 429 and to a column decoder 405 via a signal path 430. Row decoder 405 is electrically connected to a wordline buffer 413 via a signal path 414. Column decoder 405 is electrically connected to a read logic 403 and to wordline buffer 413 via signal path 431. Read logic 403 and wordline buffer 413 are electrically connected to a SRAM array 401. Control logic or an arbitrator 410 receives a clock signal 420, a read instruction 421, and a write instruction 422. A wordline receives either a read enable signal or a write enable signal from arbitrator 410. A read enable signal enables read access circuitry. A write enable signal enables write access circuitry of dual-port SRAM cell 400. A bitline receives a data bit to be stored by dual-port SRAM cell 400. Arbitrator 410 distributes clock signal 420 to read address register 406, write address register 407, data register 408, multiplexer 412, and data latch 409.

Figure 5:
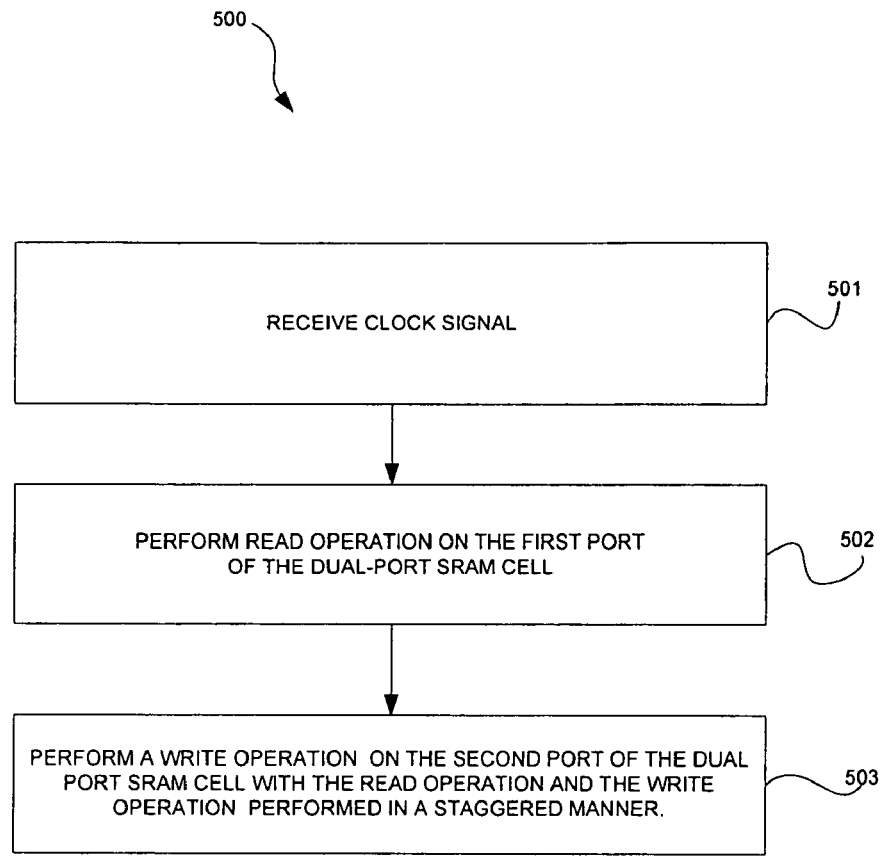
FIG. 5 shows a method of coupling data bits within a dual-port SRAM cell fabricated by the method shown in FIG. 1 in accordance with an embodiment the present invention.

Now referring to FIG. 5, a method 500 of coupling data bits is disclosed. In operation, in one clock cycle, the port dedicated exclusively to the write operation performs the write operation while the read port is precharged. After the write operation has completed, the read operation begins.

Accordingly, the read operation and the write operation are carried out in a staggered manner so that one port is always on.

Referring to step 501, a clock signal is received. In the present embodiment, the clock signal is received at a dual-port SRAM cell that includes one port dedicated exclusively to a read operation and the other port dedicated exclusively to a write operation. This dual-port SRAM cell can be formed in accordance with method 100 of FIG. 1.

Continuing with step 501, in 6-T dual-port SRAM cell 200 shown in FIG. 2, the clock signal is received at either READ wordline 244 or WRITE wordline 246 of 6-T dual-port SRAM cell 200. In this embodiment, READ access NMOS transistor 231 can be of the opposite type of WRITE access circuitry 220. More specifically, READ access circuitry 230 includes NMOS transistor 231 whose gate is electrically connected to the inverse of the clock signal. In one embodiment READ access circuitry 230 can include a PMOS transistor. In operation, at the rising edge of the clock signal, WRITE access NMOS transistor 241 is ON and the READ access NMOS transistor 231 is OFF. During the ON state of the clock signal (CLK), READ bitline 201 is precharged. At the falling edge of the clock signal (CLK is LOW), READ access NMOS transistor 231 is ON and the WRITE access NMOS transistor 241 is OFF.

Continuing with step 501, in the 8-T dual-port SRAM cell 300 shown in FIG. 3, the clock signal (CLK) is received at WRITE wordline 346 and the inverse clock signal (CLK) is received at READ wordline 344. As the clock signal (CLK) goes HIGH, WRITE access NMOS transistor 321 and complement WRITE access NMOS transistor 322 are ON. At this time, READ access NMOS transistor 311 and complement READ access NMOS transistor 312 are OFF. During this time, READ bitline 301 and complement READ bitline 304 are precharged.

Continuing with step 501, in the embodiment of FIG. 4, clock signal (CLK) is received by arbitrator 410. Arbitrator 410 passes clock signal (CLK) to dual-port SRAM array 401.

Now referring to step 502, a read operation is performed on the dedicated read only port of the dual-port SRAM cell. Before the read operation, the read bitline and the complement read bitline are precharged to a reference voltage. As a result, when the read instruction starts, the access transistors pull the bitlines to the correct values based on the values previously stored in the storage element.

In the embodiment in which 6-T dual-port SRAM cell 200 of FIG. 2 is used, the read operation is performed on READ access circuitry 230. In particular, the read operation is performed on READ access NMOS transistor 231. When storage element 200 stores logic HIGH (node 1 will have a logic 0 or LOW), READ access NMOS transistor 231 discharges into node 1 because READ bitline 201 has been precharged to a reference voltage higher than the voltage at node 1. In one embodiment, the reference voltage is set to half of supply voltage ($V_{dd}$) 252 so as to avoid fully turning on READ access NMOS transistor 231. If READ access NMOS transistor 231 were in a fully on state, it could inadvertently flip the logic state stored at node 1. In the case where storage element 200 stores logic LOW (node 1 will have a logic 1 or HIGH), node 1 discharges into READ bitline 201. Thus, READ access circuitry 230 reads the complement of data bit stored at node 1. To ensure READ access circuitry 230 reads the correct data bit, inverter 232 (not shown) is electrically connected to the drain of READ access NMOS transistor 231 to invert the complement data bit at node 1. In one embodiment, inverter 232 (not shown) is electrically connected to a sense amplifier (not shown) electrically connected to READ bitline 201.

Referring again to step 502, in the embodiment in which 8-T dual-port SRAM cell 300 of FIG. 3 is used, the read operation is performed on READ access circuitry 310. In one embodiment, the read operation is performed on READ access NMOS transistor 311 and complement READ access NMOS transistor 312. READ wordline 344 is raised to logic 1 or HIGH. As a result, READ access NMOS transistor 311 and complement READ access transistor 312 are both turned ON. If storage element 200 stores a logic LOW (logic 0 or LOW is stored at node 1), READ access NMOS transistor 311 forces READ bitline 301 to logic 0 or LOW. Conversely, if storage element 200 stores logic HIGH (node 1 stores a logic HIGH or 1), READ access NMOS transistor 312 raises complement READ bitline 302 to logic 1 or HIGH.

Continuing with step 502, in the embodiment shown in FIG. 4, in a read operation, I/O circuitry 450 of dual-port SRAM memory device 400 receives data bits at data register 408. At the same time, arbitrator 410 receives a read instruction and address register 406 receives the addresses to be read from. Multiplexer 412 forwards the read addresses to row decoder 404 and column decoder 405. Row decoder 404 selects read wordlines and column decoder selects read bitlines. Read logic 403 carries out the read operation to specific 6-T dual-port SRAM cells 200 or 8-T dual-port SRAM cells 300 identified by row decoder 404 and column decoder 405.

Referring to step 503, a write operation is performed. In one embodiment, the write operation is performed using the write-only port of a dual-port SRAM cell formed by method 100 of FIG. 1. In the present embodiment, the write operation is performed while the read operation is precharged. In a write operation, the corresponding wordline of the selected dual-port SRAM cell is raised to a desired threshold voltage. Then the bitlines of the selected dual-port SRAM cell are applied to their respective correct voltages so that the WRITE access circuitry can change the memory cell to the correct data bit. For example, when the bitline is turned ON and the complement bitline is turned OFF, logic 1 or HIGH is stored in the memory cell (node 1 stores logic HIGH.

Continuing with step 503, in the embodiment shown in FIG. 2, 6-T dual-port SRAM cell 200 performs a write operation on WRITE access circuitry 240 only (READ access circuitry 230 is not used). In one embodiment, the write operation is performed by WRITE access NMOS transistor 241. At the rising edge of the clock signal, clock signal goes HIGH and is applied at WRITE wordline 246, WRITE access NMOS transistor 241 is ON. If a data bit 0 is to be written to storage element 200, WRITE bitline 202 is charged with a logic 0. Node 2 and the input to first CMOS inverter 210 are pulled down logic 0 by WRITE access NMOS transistor 241. In response, pull-up PMOS transistor 212 is ON and pull-down NMOS transistor 214 is OFF. The ON pull-up PMOS transistor 212 pulls node 1 to logic HIGH, thus logic 1 is written in storage element 200 at node 1. Logic 1 at node 1 turns on pull-down NMOS transistor 224 and turns off pull-up PMOS transistor 222. As a result, node 2 retains logic 0 and node 1 a logic 1. If a data bit 1 is to be written into storage element 200, WRITE bitline 202 is now charged with logic 1. Node 2 and the input of first CMOS inverter 210 are pulled up to logic 1 by WRITE access NMOS transistor 241. Now, pull-down NMOS transistor 214 is ON, pulling down node 1 to electrical ground 250. As node 1 is pulled down to logic 0, second CMOS inverter 220 receives logic 0 at its input. As a result, pull-up PMOS transistor 222 is ON, pulling node 2 to $V_{dd}$ or logic 1. Thus, data bit 1 is stored at node 2 and complement data bit 0 is stored at node 1. During the write operation, READ wordline 244 receives a low clock signal and READ access NMOS transistor 231 is OFF. READ bitline 201 is precharged to a reference voltage. In one embodiment, the reference voltage can be half of supply voltage ($V_{dd}$) 252 to keep power consumption minimal and to avoid fully turning on READ access NMOS transistor 231 so that READ access NMOS transistor 231 does not flip the logic state at node 1. thus, in step 503, 6-T dual-port SRAM cell 200 writes complement data bit on node 1 and data bit on node 2.

Continuing with step 503, in the embodiment shown in FIG. 3, 8-T dual-port SRAM cell 300 performs a write operation using write access circuitry 320 only (READ access circuitry 310 is not used). At the rising edge of clock signal CLK, WRITE wordline 346 is raised to a logic 1 or HIGH. As a result, both WRITE access NMOS transistor 321 and complement WRITE access NMOS transistor 322 are turned ON. To write a logic 1 or HIGH on node 1, WRITE bitline 303 is raised to logic 1. WRITE access NMOS transistor 321 pulls node 1 up to the voltage at WRITE bitline 303. As node 1 is pulled to logic 1, second CMOS inverter 220 produces logic 0 or LOW at node 2. This is because pull-up PMOS transistor 222 is OFF and pull-down NMOS 224 is ON, pulling node 2 toward electrical ground 250. As node 2 is pulled down to logic 0, first CMOS inverter 210 receives logic 0 and produces logic 1 at node 1. As a result, logic 1 or HIGH is written at node 1 and logic 0 or LOW is written at node 2. During a write operation, complement WRITE bitline 304 is charged with a logic state inverse of WRITE bitline 303 to assist WRITE access NMOS transistor 321 in storing the correct logic state to storage element 200. Thus, in step 503, 8-T dual-port SRAM cell 300 write data bit on node 1 and complement data bit on node 2.

To write logic 0 at node 1 and logic 1 at node 2, WRITE wordline 346 is raised to a correct voltage level to turn on both WRITE access NMOS transistor 321 and complement WRITE access NMOS transistor 322. Then WRITE bitline 303 is charged with to logic 0 or LOW. In response, WRITE access NMOS transistor 321 pulls node 1 down to logic 0. As node 1 is pulled LOW, pull-up PMOS transistor 222 is ON, pulling node 2 up to supply voltage ($V_{dd}$) 252 or logic 1. Pull-down NMOS transistor 224 is OFF, shielding node 2 from electrical ground 250. When node 2 is at logic 1 or HIGH, pull-up PMOS transistor 212 of first CMOS inverter 210 is OFF, and pull-down NMOS transistor 214 is ON, pulling node 1 toward electrical ground 250. Thus, node 1 now stores logic 0 and node 2 stores logic 1.

During the WRITE operation described above, READ bitline 301 and complement READ bitline 302 are precharged. By performing the READ operation and the WRITE operation are performed in a staggered manner, data bit corruption is prevented.

Continuing with step 503, in a write operation, I/O circuitry 450 of dual-port SRAM memory device 400 receives data bits at data register 408. At the same time, arbitrator 410 receives a write instruction and address register 407 receives the addresses to be written to. Multiplexer 412 forwards the write addresses to row decoder 404 and column decoder 405. Row decoder 404 selects write wordlines and column decoder selects write bitlines. Write driver 402 carries out the write operation to specific SRAM cells 200 or 8-T dual-port SRAM cells 300 identified by row decoder 404 and column decoder 405.

Figure 6:
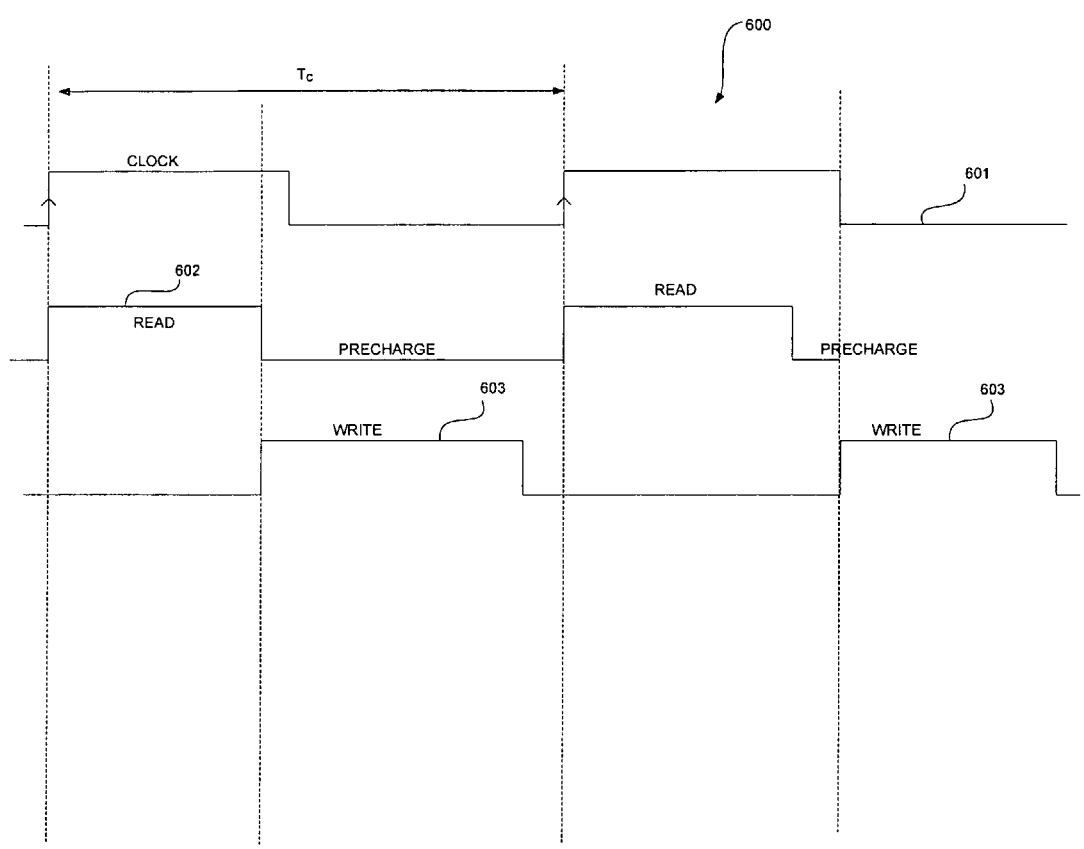
FIG. 6 shows exemplary timing diagrams that show the reading operation and the writing operation performed in a staggered manner within a clock cycle in accordance with an embodiment of the present invention.

Now referring to FIG. 6, exemplary timing diagrams 600 that show a read operation and a write operation performed in a staggered manner within a single clock cycle of a clock signal 601 in accordance with an embodiment of the present invention. More particularly, both operations are performed at different times, e.g., the READ operation is carried out after the WRITE operation is completed and vice versa on either 6-T dual-port SRAM cells 200 or 8-T dual-port SRAM cells 300.

In the embodiment shown in FIG. 4, clock signal 420 represented by a clock waveform 601 is received at arbitrator 410 of dual-port SRAM memory device 400. Arbitrator 410 distributes clock signal waveform 601 to different devices in dual-port SRAM memory device 400 to perform different tasks at particular times. Waveform 601 that shows an exemplary clock waveform having a clock cycle $T_C$ can be coupled through READ wordline 244 (FIG. 2) or READ wordline 344 (FIG. 3). A READ instruction represented by a waveform 602 received is by read logic 403 and starts at the rising edge of waveform 601. Waveform 602 goes HIGH at the rising edge of clock signal waveform 602 and the READ instruction is performed. During the time period that waveform 602 is HIGH, a waveform 603 representing the WRITE instruction remains LOW.

In the present embodiment, the READ operation is performed as described by step 502 of FIG. 5. In the embodiment in which 6-T dual-port SRAM cell 200 of FIG. 2 is used, the read operation is performed on READ access circuitry 230. In particular, the read operation is performed on READ access NMOS transistor 231. When storage element 200 stores logic HIGH (node 1 will have a logic 0 or LOW), READ access NMOS transistor 231 discharges into node 1 because READ bitline 201 has been precharged to a reference voltage higher than the voltage at node 1. In one embodiment, the reference voltage is set to half of supply voltage ($V_{dd}$) 252 so as to avoid fully turning on READ access NMOS transistor 231. If READ access NMOS transistor 231 were in a fully on state, it could inadvertently flip the logic state stored at node 1. In the case where storage element 200 stores logic LOW (node 1 will have a logic 1 or HIGH), node 1 discharges into READ bitline 201. Thus, READ access circuitry 230 reads the complement of data bit stored at node 1. To ensure READ access circuitry 230 reads the correct data bit, inverter 232 (not shown) is electrically connected to the drain of READ access NMOS transistor 231 to invert the complement data bit at node 1. In one embodiment, inverter 232 is electrically connected to a sense amplifier (not shown) electrically connected to READ bitline 201.

In the embodiment in which 8-T dual-port SRAM cell 300 of FIG. 3 is used, the read operation is performed on READ access circuitry 310. In one embodiment, the read operation is performed on READ access NMOS transistor 311 and complement READ access NMOS transistor 312. READ wordline 344 is raised to logic 1 or HIGH by waveform 602. As a result, READ access NMOS transistor 311 and complement READ access transistor 312 are both turned ON. If storage element 200 stores a logic LOW (logic 0 or LOW is stored at node 1), READ access NMOS transistor 311 forces READ bitline 301 to logic 0 or LOW. Conversely, if storage element 200 stores logic HIGH (node 1 stores a logic HIGH or 1), READ access NMOS transistor 312 raises complement READ bitline 302 to logic 1 or HIGH.

After READ operation is complete, waveform 602 goes LOW and READ bitlines of either 6-T dual-port SRAM cell 200 or 8-T dual-port SRAM cell 300 are precharged. During the precharge of the READ operation, waveform 603 representing the WRITE instruction goes HIGH and the WRITE operation is performed in accordance with step 503 of FIG. 5. More particularly, when the signal on WRITE wordline 246 (FIG. 2) or WRITE wordline 346 (FIG. 3) goes HIGH, data on WRITE bitline 202 (FIG. 2) or WRITE bitline 302 (FIG. 3) is written into storage element 200.

In the embodiment shown in FIG. 2, 6-T dual-port SRAM cell 200 performs a write operation on WRITE access circuitry 240 only (READ access circuitry 230 is not used). In one embodiment, the write operation is performed by WRITE access NMOS transistor 241. During the clock cycle $T_C$ of clock waveform 601, write waveform 603 goes HIGH and is applied at WRITE wordline 246, WRITE access NMOS transistor 241 is ON. If a data bit 0 is to be written to storage element 200, WRITE bitline 202 is charged with logic 0. Node 2 and the input to first CMOS inverter 210 are pulled down logic 0 by WRITE access NMOS transistor 241. In response, pull-up PMOS transistor 212 is ON and pull-down NMOS transistor 214 is OFF. The ON pull-up PMOS transistor 212 pulls node 1 to logic HIGH, thus logic 1 is written in storage element 200 at node 1. Logic 1 at node 1 turns on pull-down NMOS transistor 224 and turns off pull-up PMOS transistor 222. As a result, node 2 retains logic 0 and node 1 a logic 1. If a data bit 1 is to be written into storage element 200, WRITE bitline 202 is now charged with logic 1. Node 2 and the input of first CMOS inverter 210 are pulled up to logic 1 by WRITE access NMOS transistor 241. Now, pull-down NMOS transistor 214 is ON, pulling down node 1 to electrical ground 250. As node 1 is pulled down to logic 0, second CMOS inverter 220 receives logic 0 at its input. As a result, pull-up PMOS transistor 222 is ON, pulling node 2 to $V_{dd}$ or logic 1. Thus, data bit 1 is stored at node 2 and complement data bit 0 is stored at node 1. During the write operation (write waveform 603 is HIGH), READ waveform 602 is LOW and READ access NMOS transistor 231 is OFF. When waveform 602 is LOW and waveform 603 is HIGH, READ bitline 201 is precharged to a reference voltage. In one embodiment, the reference voltage can be half of supply voltage ($V_{dd}$) 252 to keep power consumption minimal and to avoid fully turning on READ access NMOS transistor 231 so that READ access NMOS transistor 231 does not flip the logic state at node 1.

In the embodiment shown in FIG. 3, 8-T dual-port SRAM cell 300 performs a write operation using write access circuitry 320 only (READ access circuitry 310 is not used). At the rising edge of write waveform 603, WRITE wordline 346 is raised to a logic 1 or HIGH. As a result, both WRITE access NMOS transistor 321 and complement WRITE access NMOS transistor 322 are turned ON. To write a logic 1 or HIGH on node 1, WRITE bitline 303 is raised to logic 1. WRITE access NMOS transistor 321 pulls node 1 up to the voltage at WRITE bitline 303. As node 1 is pulled to logic 1, second CMOS inverter 220 produces logic 0 or LOW at node 2. This is because pull-up PMOS transistor 222 is OFF and pull-down NMOS 224 is ON, pulling node 2 toward electrical ground 250. As node 2 is pulled down to logic 0, first CMOS inverter 210 receives logic 0 and produces logic 1 at node 1. As a result, logic 1 or HIGH is written at node 1 and logic 0 or LOW is written at node 2. During the time period when write waveform 603 is HIGH, complement WRITE bitline 304 is charged with a logic state inverse of WRITE bitline 303 to assist WRITE access NMOS transistor 321 in storing the correct logic state to storage element 200. Thus, 8-T dual-port SRAM cell 300 write data bit on node 1 and complement data bit on node 2.

When write waveform 603 is HIGH, to write logic 0 at node 1 and logic 1 at node 2, waveform 603 is applied to WRITE wordline 346 to turn on both WRITE access NMOS transistor 321 and complement WRITE access NMOS transistor 322. Then WRITE bitline 303 is charged with to logic 0 or LOW. In response, WRITE access NMOS transistor 321 pulls node 1 down to logic 0. As node 1 is pulled LOW, pull-up PMOS transistor 222 is ON, pulling node 2 up to supply voltage ($V_{dd}$) 252 or logic 1. Pull-down NMOS transistor 224 is OFF, shielding node 2 from electrical ground 250. When node 2 is at logic 1 or HIGH, pull-up PMOS transistor 212 of first CMOS inverter 210 is OFF, and pull-down NMOS transistor 214 is ON, pulling node 1 toward electrical ground 250. Thus, node 1 now stores logic 0 and node 2 stores logic 1.

Figure 7:
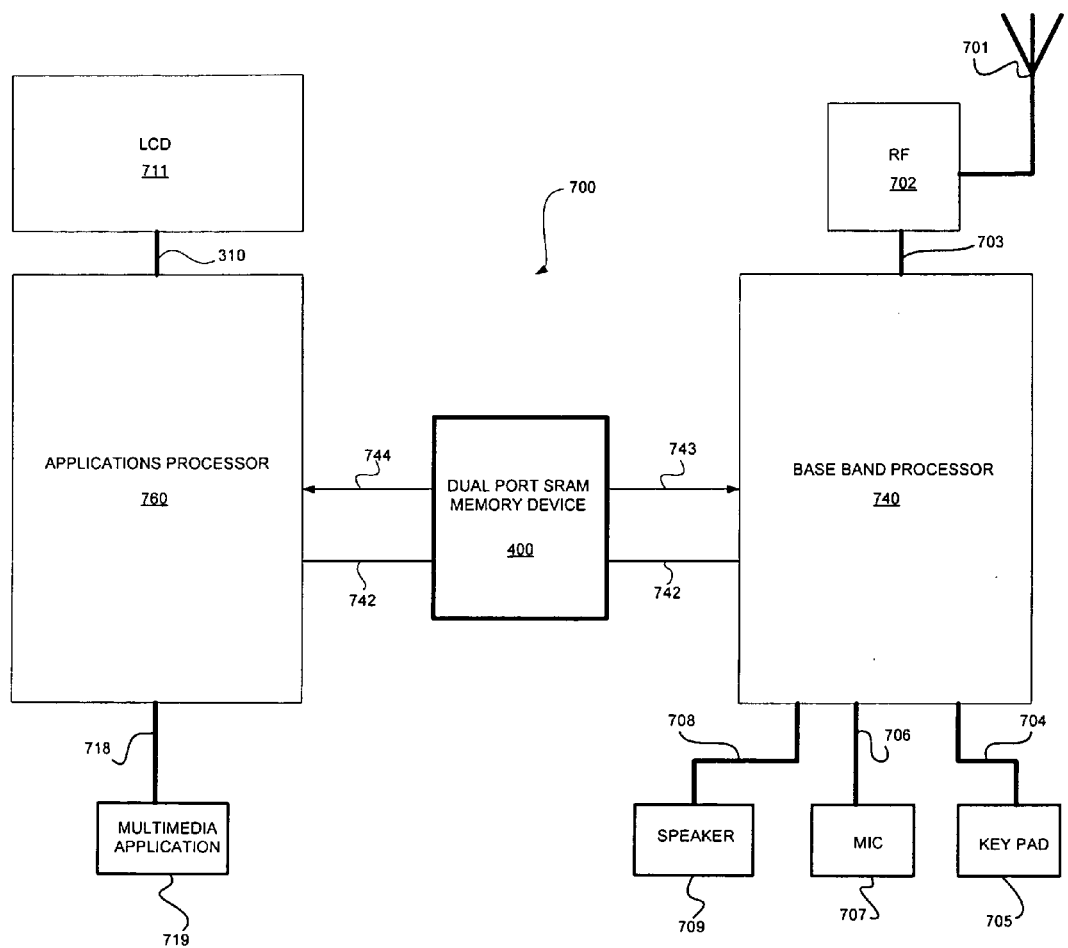
FIG. 7 is a block diagram illustrating a wireless cellular telephone system that includes a dual-port Static Random Access Memory (SRAM) memory device fabricated by the method of FIG. 1 in accordance with an embodiment of the present invention.

Now referring to FIG. 7, an exemplary use of dual-port SRAM cell 200, 8-T dual-port SRAM cell 300, and dual-port SRAM memory device 400 is illustrated by a mobile phone system 700. Mobile phone system 700 is shown that includes a baseband processor 740, an application processor 760, and dual-port Static Random Access Memory (SRAM) memory device 400. Dual-port SRAM memory device 400 interfaces and facilitates the exchange of data between baseband processor 740 and application processor 760.

More particularly, base band processor 740 is electrically connected to a dual-port SRAM memory device 400 via a control address signal path 742. Dual-port SRAM memory device 400 is also electrically connected to application processor 760 via another control address signal path 742. A first interrupt connection 743 is used to interrupt the data flow between dual-port SRAM memory device 400 and baseband processor 740. A second interrupt connection 744 is used to interrupt the data flow from application processor 760 to dual-port SRAM memory device 400.

Baseband processor 740 handles basic telephone functions such as dialing, receiving and sending phone signals and text messages. Baseband processor 740 is electrically connected to a Radio Frequency (RF) receiver 702 via electrical path 703. RF receiver 702 is electrically connected to an antenna 701 for receiving and transmitting RF signals. Base band processor 740 is electrically connected to a key pad 705 via electrical path 704, a microphone (MIC) 707 via signal path 706, and a speaker 709 via signal path 708.

Application processor 760 is dedicated to processing heavy loading multimedia applications. A multimedia application is defined as the combination and integration of more than one media format into a presentation or program that supports the interactive use of text, audio, still images, video, and graphics. Each of these elements must be converted in some way from analog form to digital form before they can be used in a computer application. Multimedia application 719 may be a Global Positioning System (GPS), a Bluetooth wireless device, a MPEG-4 camera, and/or any of a number of other devices. Application processor 760 is electrically connected to a Liquid Crystal Display (LCD) 711 via signal path 710 and is electrically connected to a multimedia application 719 via a signal path 718.

Baseband processor 740 and application processor 760 can access data any location in the dual-port SRAM memory device 400 whenever it is needed. In the modular architecture of the present embodiment of the mobile phone system 700, dual SRAM memory device 400 functions as a cache memory to facilitate data flow between baseband processor 740 and application processor 760. This dual processors solution separates baseband tasks and application tasks. Baseband processor 740 handles basic phone functions and application processor 760 handles multimedia functions.

Baseband processor 740 processes basic phone features such as making and/or receiving calls. Application processor 760 is dedicated to processing other applications such as heavy loading multimedia applications.

Referring to FIG. 7 again, data blocks are first received at baseband processor 740 and down converted to baseband signals. Signals in form of analog RF signals are first received at antenna 701. RF receiver 702 filters out unwanted signals, down converted the received signals to a baseband signals and transferred the downconverted signal to baseband processor 740 for signal processing for basic telephone functions. The processed signals can be either a text message or a voice message. Base band processor 740 can also function as a transmitter. A text message is entered by key pad 705, transferred to base band processor 740 via signal path 703 and sent out to RF antenna 701 via RF circuit 702. If the down converted signals need to be sent to application processor 760 for signal processing for multimedia applications, the down converted signals are digitized into data bit streams of 0 and 1. The data bit streams are sent to dual-port SRAM memory device 400 via signal path 742. Dual-port SRAM memory device 400 carries out method 500 to write and read these data bit streams into array of dual-port SRAM cells 401. In the present invention, dual-port SRAM memory device 400 reads and writes data streams synchronously. Application processor 760 reads data from dual-port SRAM memory device 400 and sends data to each particular multimedia application 710. After processing, data are sent to LCD 711 for display or back to baseband processor 740.

In operation, I/O circuitry 450 of dual-port SRAM memory device 400 sort out whether data are received from baseband processor 740 or from application processor 760. Data from baseband processor 740 are forward by I/O circuitry 450 to data register 408 via signal path 723. At the same time, arbitrator 410 receives a write instruction and address register 407 receives the addresses of these data. Multiplexer 412 forwards the write addresses to row decoder 404 and column decoder 405. Row decoder 404 selects wordlines 414 and column decoder selects bitlines 415. Write driver 402 carries out the write operation to specific SRAM cells identified by row decoder 404 and column decoder 405. In accordance to the present invention, the read operation begins after the write operation. Read addresses are received at read address register 406 and the read instruction is received at arbitrator 410. Multiplexer 412 forwards read addresses to read decoder 404 and column decoder 405 for selecting specific SRAM cells 120 in dual-port SRAM array 401. Read logic circuitry 403 carries the read operation on those selected cells). At the end of the read operation, data latch 409 of I/O circuitry 450 forwards the read data to application processor 360.

Although FIG. 7 shows 6-T dual-port SRAM cell 200 of FIG. 2 or 8-T dual-port SRAM cell 300 of FIG. 3 implemented in dual-port memory device 400, it is appreciated that 6-T dual-port SRAM cells 200 or 8-T dual-port SRAM cells 300 could also be implemented in single-port SRAM devices or multi-port SRAM devices.

Although the invention has been described in connection with several embodiments, it is understood that this invention is not limited to the embodiments disclosed, but is capable of various modifications, which would be apparent to a person skilled in the art. Thus, the invention is limited only by the following claims.

What is claimed is:

1. A dual-port Static Random Access Memory (SRAM) cell comprising:

a storage element having a dedicated read port and a dedicated write port;

write access circuitry electrically coupled to the dedicated write port of the storage element, the write access circuitry dedicated exclusively to a write operation, the write access circuitry operable, upon receiving a write enable signal and a clock signal, to write a data bit into the write port of the storage element; and read access circuitry electrically coupled to the dedicated read port of the storage element, the read access circuitry dedicated exclusively to a read operation, the read access circuitry operable, upon receiving a read enable signal and the clock signal, to read the data bit from the dedicated read port of the storage element, the read operation and said write operation performed in a staggered manner within one cycle of said clock signal.

2. The dual-port SRAM cell of claim 1 wherein the read access circuitry further comprises complement read access circuitry electrically coupled to the storage element, the complement read access circuitry operable, upon receiving the clock signal and the read enable signal, to read a complement data bit from the storage element.

3. The dual-port SRAM cell of claim 1 wherein the write access circuitry further comprises complement write access circuitry electrically coupled to the storage element, the complement write access circuitry operable, upon receiving the clock signal and the write enable signal, to write a complement data bit from the storage element.

4. The dual-port SRAM cell of claim 1 wherein the storage element further comprises:

a first Complementary Metal Oxide Semiconductor (CMOS) inverter including a first pull-up PMOS transistor coupled in series with a first pull-down NMOS transistor, the gate of the first pull-up PMOS transistor electrically coupled to the gate of the first pull-down NMOS transistor to form an input of the first CMOS inverter, the drain of the first pull-up PMOS transistor electrically coupled to the drain of the first pull-down NMOS transistor to form an output of the first CMOS inverter; and a second CMOS inverter electrically cross-coupled to the first CMOS inverter, the second CMOS inverter including a second pull-up PMOS transistor electrically coupled in series with a second pull-down NMOS transistor, the source of the first pull-up PMOS transistor electrically coupled to the source of the second pull-up PMOS transistor and to a supply voltage, the source of the first pull-down NMOS transistor electrically coupled to the source of the second pull-down NMOS transistor and to an electrical ground, the gate of the second pull-up PMOS transistor electrically coupled to the gate of the second pull-down NMOS transistor to form an input of the second CMOS inverter, the drain of the second pull-up PMOS transistor electrically coupled to the drain of the second pull-down NMOS transistor to form an output of the second CMOS inverter, the output of the second CMOS inverter electrically coupled to the input of the first CMOS inverter, the output of the first CMOS inverter electrically coupled to the input of the second CMOS inverter.

5. The dual-port SRAM cell of claim 4 wherein the read access circuitry has a size that is smaller than that of the first pull-down NMOS transistor and smaller than that of the second pull-down NMOS transistor, and wherein the write access circuitry has a size that is smaller than that of the first pull-down NMOS transistor and smaller than that of the second pull-down NMOS transistor.

6. The dual-port SRAM cell of claim 4 wherein the read access circuitry further comprises a first NMOS transistor and wherein the write access circuitry further comprises a second NMOS transistor, and wherein the channel length of the first NMOS transistor is less than that of the first pull-down NMOS transistor and is less than that of the second pull-down NMOS transistor, wherein the channel length of the second NMOS transistor is less than that of the first pull-down NMOS transistor and is less than that of the second pull-down NMOS transistor.

7. The dual-port SRAM cell of claim 4 wherein the read access circuitry further comprises a first NMOS transistor and wherein the write access circuitry further comprises a second NMOS transistor, and wherein the ratio of the channel width over the channel length (W/L) of the first NMOS transistor is less than that of the first pull-down NMOS transistor and less than that of the second pull-down NMOS transistor, wherein the ratio of the channel width over the channel length (W/L) of the second NMOS transistor is less than that of said the first pull-down NMOS transistor and less than that of the second pull-down NMOS transistor.

8. The dual-port SRAM cell of claim 4 wherein the read access circuitry further comprises a first NMOS transistor and wherein the write access circuitry further comprises a second NMOS transistor, and wherein the channel width of the first NMOS transistor is smaller than that of the first pull-down NMOS transistor and smaller than that of the second pull-down NMOS transistor, and wherein the channel width of the second NMOS transistor is smaller than that of the first pull-down NMOS transistor and smaller than that of the second pull-down NMOS transistor.

9. The dual-port SRAM cell of claim 4 wherein the write access circuitry writes the data bit into the storage element during the write operation and the read access circuitry reads a complement of the data bit during the read operation, the dual-port SRAM cell further comprising an inverting means electrically coupled to the read access circuitry, upon receiving the complement data bit from the read access circuitry, for inverting the complement data bit so that the read access transistor circuitry reads out the data bit.

10. The dual-port SRAM cell of claim 9 wherein the read access circuitry has a size that is smaller than that of the first pull-down NMOS transistor and smaller than that of the second pull-down NMOS transistor, and wherein the write access circuitry has a size that is smaller than that of the first pull-down NMOS transistor and smaller than that of the second pull-down NMOS transistor.

11. The dual-port SRAM cell of claim 9 wherein the read access circuitry further comprises a first NMOS transistor and wherein the write access circuitry further comprises a second NMOS transistor, and wherein the channel length of the first NMOS transistor is less than that of the first pull-down NMOS transistor and is less than that of the second pull-down NMOS transistor, wherein the channel length of the second NMOS transistor is less than that of the first pull-down NMOS transistor and is less than that of the second pull-down NMOS transistor.

12. The dual-port SRAM cell of claim 9 wherein the read access circuitry further comprises a first NMOS transistor and wherein the write access circuitry further comprises a second NMOS transistor, and wherein the ratio of the channel width over the channel length (W/L) of the first NMOS transistor is less than that of said first pull-down NMOS transistor and less than that of the second pull-down NMOS transistor, wherein the ratio of the channel width over the channel length (W/L) of the second NMOS transistor is less than that of the first pull-down NMOS transistor and less than that of the second pull-down NMOS transistor.

13. The dual-port SRAM cell of claim 9 wherein the read access circuitry further comprises a first NMOS transistor and wherein the write access circuitry further comprises a second NMOS transistor, and wherein the channel width of the first NMOS transistor is smaller than that of the first pull-down NMOS transistor and smaller than that of the second pull-down NMOS transistor, and wherein the channel width of the second NMOS transistor is smaller than that of the first pull-down NMOS transistor and smaller than that of the second pull-down NMOS transistor.

14. The dual-port SRAM cell of claim 9 wherein the inverting means further comprises a third CMOS inverter.

15. A dual-port Static Random Access Memory (SRAM) memory device comprising:

an array of dual-port SRAM cells, arranged in rows and columns, the array of dual-port SRAM cells operable to store data bits and complement data bits, each of the rows having a word address and each of the columns having a bit address, each dual-port SRAM cell further comprising:

a storage element having a dedicated read port and a dedicated write port;

write access circuitry electrically coupled to the dedicated write port of the storage element, the write access circuitry dedicated exclusively to a write operation, the write access circuitry operable, upon receiving a write enable signal and the clock signal, to write the data bit into the dedicated write port of the storage element; and read access circuitry electrically coupled to the dedicated read port of the storage element, the read access circuitry dedicated exclusively to a read operation, the read access circuitry operable, upon receiving a read enable signal and the clock signal, to read the data bit from the dedicated read port of the storage element, the read operation and the write operation being performed in a staggered manner within one cycle of the clock signal;

decoder circuitry electrically coupled to the array of dual-port SRAM cells for selecting the dual-port SRAM cells;

an arbitrator circuit electrically coupled to the decoder circuitry and the array of dual-port SRAM cells, the arbitrator circuit operable, upon receiving the clock signal, to produce the read enable signal and said the write enable signal in a mutually exclusive order so that the read operation and the write operation are performed in the staggered manner; and input/output (I/O) circuitry electrically coupled to the decoder, the array of dual-port SRAM cells, the arbitrator, the I/O circuitry operable, upon receiving the clock signal, to receive the data bits from external circuitry and to latch out the data bits from the arrays of dual-port SRAM cells.

16. The dual-port SRAM memory device of claim 15 wherein each of the dual-port SRAM cells comprises eight transistors.

17. The dual-port SRAM memory device of claim 15 wherein each of the dual-port SRAM cells comprises six transistors, the read access circuitry operable, upon receiving a read enable signal and the clock signal, to read the compliment of the data bit.

18. The dual-port SRAM memory device of claim 17 further comprising an inverter circuit, electrically coupled to the read access circuitry, for inverting the compliment of the data bit so as to generate the data bit.

19. A dual-port Static Random Access (SRAM) cell comprising:
    means for storing a data bit and a complement data bit;
    means for writing a data bit, electrically coupled to the means for storing a data bit and a complement data bit, and dedicated exclusively for writing a data bit into the means for storing a data bit and a complement data bit; and
    means for reading a data bit, electrically coupled to the means for storing a data bit and a complement data bit, and the means for writing a data bit, the means for reading a data bit dedicated exclusively for reading the data bit from the means for storing a data bit and a complement data bit, the means for writing a data bit and the means for reading a data bit enabled in a staggered manner so that a read operation and a write operation are performed synchronously within one clock cycle.

* * * * *

UNITED STATES PATENT AND TRADEMARK OFFICE
CERTIFICATE OF CORRECTION

PATENT NO. : 7,359,275 B1
APPLICATION NO. : 11/222390
DATED : April 15, 2008
INVENTOR(S) : Chau-Chin Wu Page 1 of 2

It is certified that error appears in the above-identified patent and that said Letters Patent is hereby corrected as shown below:

In The Drawings
Drawing Sheet 2, Figure 2 should appear as shown.

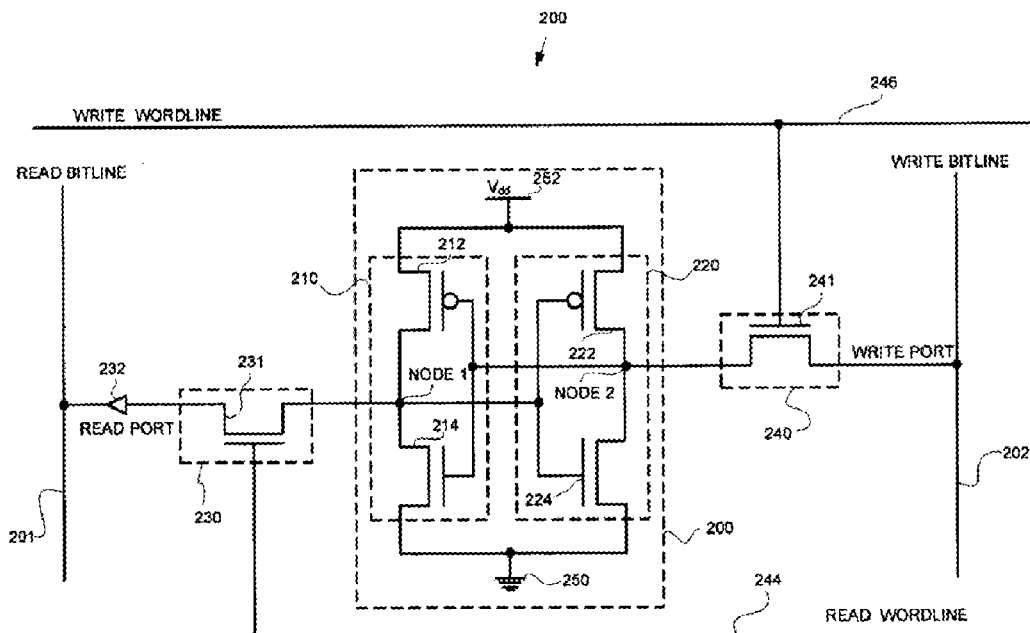

FIGURE 2

UNITED STATES PATENT AND TRADEMARK OFFICE
CERTIFICATE OF CORRECTION

PATENT NO. : 7,359,275 B1
APPLICATION NO. : 11/222390
DATED : April 15, 2008
INVENTOR(S) : Chau-Chin Wu It is certified that error appears in the above-identified patent and that said Letters Patent is hereby corrected as shown below:

Claim 1, line 17, the word "said" should read --the--.
Claim 1, line 18, the word "said" should read --the--.
Claim 7, line 10, the word "said" should be deleted.
Claim 9, line 9, the word "transistor" should be deleted.
Claim 15, line 15, the phrase "the clock signal" should read --a clock signal--.
Claim 15, line 32, the word "said" should be deleted.

Signed and Sealed this

Twelfth Day of August, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,359,275 B1 | Page 1 of 2 |
| APPLICATION NO. | : 11/222390 | |
| DATED | : April 15, 2008 | |
| INVENTOR(S) | : Chau-Chin Wu | |

It is certified that error appears in the above-identified patent and that said Letters Patent is hereby corrected as shown below:

In The Drawings
Drawing Sheet 2, Figure 2 should appear as shown.

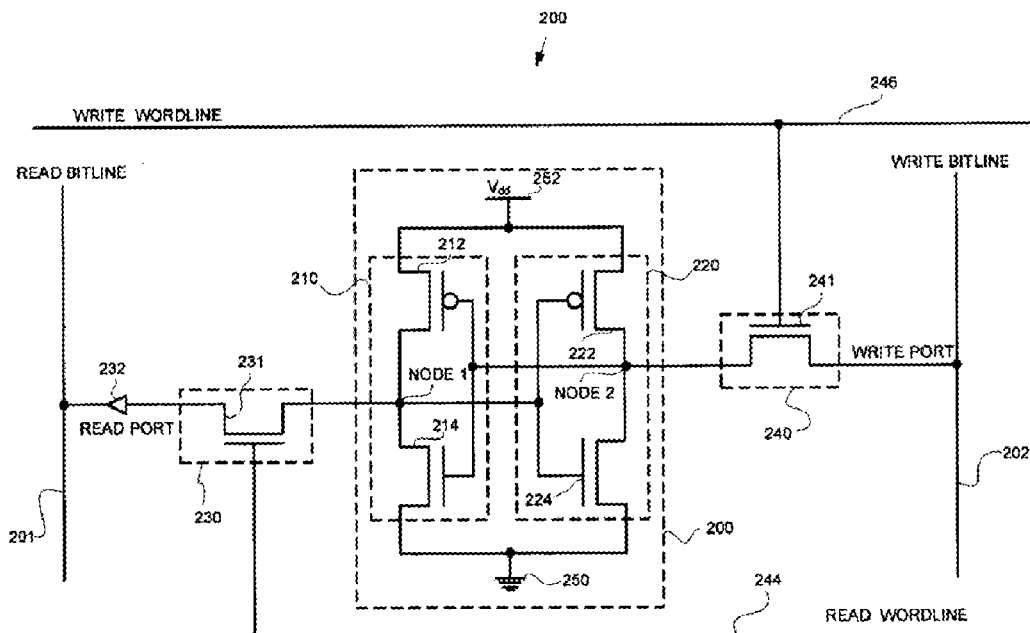

FIGURE 2

UNITED STATES PATENT AND TRADEMARK OFFICE
CERTIFICATE OF CORRECTION

PATENT NO.        : 7,359,275 B1
APPLICATION NO.   : 11/222390
DATED             : April 15, 2008
INVENTOR(S)       : Chau-Chin Wu It is certified that error appears in the above-identified patent and that said Letters Patent is hereby corrected as shown below:

Column 16, Claim 1, line 15, the word "said" should read --the--.
Column 16, Claim 1, line 16, the word "said" should read --the--.
Column 17, Claim 7, line 22, the word "said" should be deleted.
Column 17, Claim 9, line 43, the word "transistor" should be deleted.
Column 18, Claim 15, line 32, the phrase "the clock signal" should read --a clock signal--.
Column 18, Claim 15, line 50, the word "said" should be deleted.

This certificate supersedes the Certificate of Correction issued August 12, 2008.

Signed and Sealed this

Sixteenth Day of September, 2008

JON W. DUDAS
*Director of the United States Patent and Trademark Office*